United States Patent [19]
Valster et al.

[11] Patent Number: 5,204,869
[45] Date of Patent: Apr. 20, 1993

[54] RADIATION-EMITTING SEMICONDUCTOR DEVICE HAVING EMISSION IN THE VISIBLE RANGE AND A HIGH MAXIMUM OPERATING TEMPERATURE

[75] Inventors: Adriaan Valster; Coen T. H. F. Liedenbaum, both of Eindhoven, Netherlands

[73] Assignee: U.S. Philips Corp., New York, N.Y.

[21] Appl. No.: 690,443

[22] Filed: Apr. 23, 1991

[30] Foreign Application Priority Data

May 23, 1990 [NL] Netherlands .................. 9001193

[51] Int. Cl.$^5$ ............................................. H01S 3/19
[52] U.S. Cl. ...................................... 372/45; 257/79
[58] Field of Search .............. 372/45, 44, 46; 357/17

[56] References Cited
U.S. PATENT DOCUMENTS
5,107,306 4/1992 Blood et al. .................. 372/45

Primary Examiner—James W. Davie
Attorney, Agent, or Firm—Steven R. Biren

[57] ABSTRACT

Radiation-emitting semiconductor diodes in the form of a laser diode or an LED form important components in information processing systems. There is a particular demand for diodes emitting in the visible range of the spectrum and having a high permissible operating temperature. A radiation-emitting diode including a semiconductor body with a semiconductor substrate on which a lower cladding layer, an active layer, and an upper cladding layer are present, the active layer and the two cladding layers each including different semiconductor materials which form a mixed crystal, partly fulfill the above requirements. According to the invention, such a diode is characterized in that the mixed crystal of the active layer is more strongly ordered than that of the two cladding layers. This makes the difference in bandgap between these layers greater than in the known diode. The diode thus has a comparatively high $T_o$ value and accordingly a high maximum operation temperature. The invention also relates to a method of manufacturing such a diode. In this method, a difference in the degree of ordering between the active layer and the cladding layers is achieved through a change in the growing temperature or in the ratio of the quantities of the offered elements during providing of the semiconductor layers. Thus diodes—for example in the In-GaP/InAlGaP material system-with the required characteristics are obtained.

7 Claims, 3 Drawing Sheets

RADIATION-EMITTING SEMICONDUCTOR DEVICE HAVING EMISSION IN THE VISIBLE RANGE AND A HIGH MAXIMUM OPERATING TEMPERATURE

BACKGROUND OF THE INVENTION

The invention relates to a radiation-emitting semiconductor diode comprising a semiconductor body with a semiconductor substrate of a first conductivity type on which are at least present in that order a lower cladding layer of the first conductivity type, an active layer, and an upper cladding layer of a second conductivity type, the active layer and at least one of the cladding layers, to be called first cladding layer hereinafter, comprising mutually differing semiconductor materials which each comprise a mixed crystal of at least two binary compounds with two sub-lattices, atoms of different elements being present side by side on at least one of the sub-lattices, which is to be called first sub-lattice hereinafter. The invention also relates to a method of manufacturing a radiation-emitting semiconductor diode, whereby are provided on a semiconductor substrate of a first conductivity type in that order at least a lower cladding layer of the first conductivity type, an active layer, and an upper cladding layer of a second conductivity type, mutually differing semiconductor materials being chosen for the active layer and for at least one of the cladding layers, which is to be called first cladding layer hereinafter, each of the said semiconductor materials comprising a mixed crystal of at least two binary compounds and having two sub-lattices, atoms of different elements being provided on at least one sub-lattice, which is to be called first sub-lattice hereinafter.

Such radiation-emitting diodes, especially when the wavelength of the emission lies in the visible range of the spectrum, are suitable radiation sources—provided they are constructed as lasers —for inter alia information processing systems such as laser printers with which information is written, optical disc systems such as Compact Disc (Video) (CD(V)) players or bar code readers, by which information is read, and Digital Optical Recording (DOR) systems, by which information is written and read. Numerous applications are also possible in opto-electronic systems for LED versions of such diodes.

Such a radiation-emitting diode and such a method of manufacturing same are known from the article "AlGaInP Double Heterostructure Visible-Light Laser Diodes with a GaInP Active Layer Grown by Metalorganic Vapor Phase Epitaxy" by K. Kobayashi et al., published in IEEE Journal of Quantum Electronics, vol. QE-23, No. 6, June 1987, p. 704. This article describes a radiation-emitting semiconductor diode comprising an active layer situated on a substrate of n-type GaAs between two cladding layers. The active layer and the first cladding layer, both cladding layers in this case, comprise mutually differing semiconductor materials, in this case InGaP and InAlGaP, respectively, which each comprise a mixed crystal of at least two binary compounds, in this case exactly two for the active layer and three for the first cladding layer, namely InP, AlP, and GaP, and having the sub-lattices, i.e. two f.c.c. lattices, in which the atoms forming the binary compounds are present, here In, Al, and Ga atoms on the one hand and P atoms on the other hand, while atoms of different elements, in this case In and Ga atoms for the active layer and In, Al, and Ga atoms for the first cladding layer, are present side by side on at least one of the sub-lattices, in this case the sub-lattice on which In, Al and Ga atoms are present. In the radiation-emitting diode, which is constructed as a laser here, there is a strip-shaped region which acts as a resonance cavity and inside which electromagnetic radiation can be generated by the pn-junction present in the active InGaP layer when current is passing in the forward bias direction. The known diode lasers are manufactured at a growing temperature of 700° C. or lower and comprise a gallium arsenide buffer layer. The emission wavelength of the diode constructed as a laser in this case is approximately 670 nm (i.e. the wavelength in photoluminescence is approximately 660 nm, which corresponds to a bandgap of approximately 1,88 eV; it will be recognized that in this specification the European notation for a decimal point, namely a comma, is used).

A disadvantage of the known semiconductor diode laser is that its maximum operating temperature is comparatively low. This depends inter alia on the temperature dependence of the starting current. The starting current (I) is related to the temperature (T) in the following way: $I/I_o = \exp((T + \Delta T)/T_o)$, where $I_o$ is the starting current at 0° C., T the temperature of the heatsink, $\Delta T$ the temperature rise in the active region, and $T_o$ the so-called characteristic temperature. This is typically 75 up to a maximum 90 K for the known diode laser in the temperature range from 30° to 60° C., whereas, for example, the $T_o$ value may be as much as 150 K for a GaAs/AlGaAs laser, which implies a much smaller increase in the starting current with rising temperature. The value of $T_o$ is directly related to optical and electrical losses inside the laser resonance cavity and may be increased in that the difference in bandgap between the active layer and one or both cladding layers is increased. This may be achieved, for example, by increasing the aluminum content of the cladding layers, but this is less effective because of the indirect nature of these layers, and it is more difficult then to dope the cladding layers, especially the p-type cladding layer, sufficiently strongly.

SUMMARY OF THE INVENTION

The present invention has for its object inter alia to realize a radiation-emitting semiconductor diode—especially a semiconductor diode laser—which does not have or at least has to a much lesser degree the above mentioned disadvantage, i.e. which has a comparatively low temperature dependence of the starting current. The invention also has for its object to provide a simple method of manufacturing such a radiation-emitting diode.

The invention is based inter alia on the recognition that this object may be achieved through the use of another possibility than a change in the composition in order to change the bandgap of a semiconductor material.

According to the invention, a radiation-emitting semiconductor diode of the kind described above is for this purpose characterized in that the distribution of the atoms of different elements over the first sub-lattice in the active layer is ordered to a greater extent that it is in the first cladding layer, and in that the more ordered distribution at least for the semiconductor material of the active layer results in a reduced bandgap. It was experimentally ascertained that the bandgap for some semiconductor materials comprising a mixed crystal of binary compounds varies with the degree of ordering of atoms of different elements in a sub-lattice of the mixed crystal: when the degree of ordering is low, i.e. when the distribution of the atoms of different elements over the sub-lattice is more random, the bandgap for a constant composition of the mixed crystal is relatively greater. When a suitable, more ordered distribution occurs, this is accompanied by a reduction of the bandgap. In the radiation-emitting semiconductor diode according to the invention comprising the combination of a more ordered active layer and a more disorderly first cladding layer, the former will have a relatively low bandgap and the latter will have a relatively high or at least a non-reduced bandgap. Thus, the different in bandgap is increased in comparison with the situation in which the active layer and the first cladding layer are ordered or not ordered in the same way and to the same degree. The laser diode has lower losses as a result of the greater different in bandgap, resulting in a high $T_o$ value. A method of manufacturing a radiation-emitting semiconductor diode according to the invention is characterized in that the growing conditions during the provision of the first cladding layer and of the active layer are so chosen that the atoms of different elements are provided on the first sub-lattice with a more ordered distribution in the active layer than in the first cladding layer, and in that the bandgap of the various semiconductor materials is reduced by the more ordered distribution. It was found that growing conditions such as growing rate, growing temperature, and V/III ratio influence the degree of ordering in a mixed crystal. The V/III ratio is the ratio of the quantity of V-elements offered during growing to the quantity of III-elements offered. Semiconductor diode lasers which better meet the said requirements are obtained in that one or several of these growing conditions are so chosen during growing of the active layer that a more orderly distribution is created, and during growing of the first cladding layer so that a more random distribution is created.

In a first embodiment of a radiation-emitting semiconductor diode according to the invention, in which the two sub-lattices are of the f.c.c. (face centered cube) type, the distribution of the atoms of different elements over the first sub-lattice in the first cladding layer is substantially completely random whereas this distribution in the active layer is more ordered. It has been observed that a more ordered distribution resembling the ordering of the so-called CuAu or CuPt structure occurs within mixed crystals of many semiconductor materials having an f.c.c. structure. In the case of such a more ordered distribution, a reduction of the bandgap compared with a substantially completely disorderly distribution of the atoms of different elements over the first sub-lattice occurs in these semiconductor materials. Thus a more ordered distribution in the direction of the CuPt structure is observed in the mixed crystals of III-V binary compounds for the InGaP/InAlGaP material system. The ordering then takes place within the (111), more accurately within the ½(111) and ½(111) planes. Owing to the difference in ordering between the InGaP active layer and the first InAlGaP cladding layer, the different in bandgap between these layers in a radiation-emitting semiconductor diode according to the invention is relatively strongly increased, which results in a high $T_o$ value. An increase in the $T_o$ is very advantageous, particularly for these still relatively short-wave diode lasers. If the first cladding layer of InAlGaP is as disorderly as possible and contains, for example, 30 atom percents aluminum, the bandgap is approximately 2,3 eV. If the active layer of InGaP has a fairly strong ordering, the bandgap may fall as low as approximately 1,84 eV instead of approximately 1,94 eV. This decrease by 0,1 eV increases the different in bandgap from 0,4 eV to 0,5 eV, which is an increase of approximately 25%. A lesser degree of ordering of the active layer comprising InGaP lying between the said states may still lead to an attractive improvement in the $T_o$ value. Thus a $T_o$ value of 130 K was found for an active InGaP layer having a bandgap of 1,86 eV, which is much more favorable than for the known diode lasers in this material system. A bandgap value of 1,86 eV has the additional advantage that the emission wavelength of the diode layer is still comparatively low: instead of approximately 650 nm it then is approximately 670 nm, which is a suitable wavelength for many applications. It should be noted that generally the wavelength of the emission of a diode laser is approximately 10 nm higher than the wavelength found in a photoluminescence measurement. In a favorable embodiment, the substrate comprises gallium arsenide and is provided with a conducting layer at the lower side, while there are present on the upper cladding layer in that order an intermediate layer of indium-gallium phosphide or aluminum-gallium arsenide and a contact layer of gallium arsenide, which layers are of the second conductivity type, the semiconductor body comprising a mesa-shaped strip adjoining its surface, comprising at least the contact layer and covered by another conducting layer which extends to outside the mesa-shaped strip and outside this strip forms a junction constituting a barrier with a layer situated below it. This embodiment has an excellent current limitation, a low starting current which also favors a high operating temperature, and is in addition easy to realize.

A first embodiment of a method according to the invention, in which III-V compounds are chosen as the binary compounds, is characterized in that the growing temperature and the ratio of the quantity of V-elements offered to the quantity of III-elements offered, referred to as V/III ratio hereinafter, are chosen to be the growing conditions. Among the growing conditions influencing the degree of ordering in a mixed crystal, such as the growing temperature, the V/III ratio and the growing rate, the former two were found to be most suitable in practice. In a first variant, the first cladding layer and the active layer are provided with a constant V/III ratio, the first cladding layer being provided at a comparatively high growing temperature and the active layer being provided at a usual growing temperature. In this way the distribution of elements over the first sub-lattice in the first cladding layer is random to a high degree, whereas this distribution in the active layer is fairly strongly ordered. Thus the different in bandgap between these layers is comparatively great, at least greater than in the known method whereby the layers are provided at the same temperature. A usual growing temperature for InGaP and InAlGaP is approximately 700° C. Favorable results are obtained when the first cladding layer is provided at approximately 760° C. and the active layer at approximately 700° C., while the V/III ratio is maintained at approximately 300 for both layers. In a further variant, the first cladding layer is provided at a strongly raised growing temperature and a usual V/III ratio, while the active layer is provided at a slightly raised growing temperature and with an increased V/III ratio. A low V/III ratio—for example lower than 100—was found to give an increasing degree of disorder, just as a higher growing temperature. A greater degree of disorder is created in the cladding layer in that the growing temperature during providing of the first cladding layer is comparatively strongly increased. An increase in the V/III ratio during growing of the active layer promotes the ordering thereof. A slight increase in the growing temperature during providing of the active layer does have a counterproductive effect on the ordering of this layer, but it keeps the temperature difference between the active layer and the first cladding layer restricted, which promotes a fast heating-up or cooling-down which is safe for the interface between this layer and the first cladding layer. Preferably, the growing temperature in this variant is chosen to be approximately 760° C. for the first cladding layer and approximately 730° C. for the active layer, while the V/III ratio during growing of the active layer is chosen to be approximately 700. In a further variant, the first cladding layer and the active layer are provided at the same temperature, which is slightly raised relative to the usual temperature, while the V/III ratio is increased during providing of the active layer. The increase of the V/III ratio during growing of the active layer promotes the ordering thereof. In this case the different in ordering between the active and the first cladding layer is obtained as a result of the increase of the V/III ratio during providing of the active layer. The fact that the growing temperature is constant has the advantage that heating-up or cooling-down during the growing process is not necessary. Preferably, the growing temperature for the first cladding layer and the active layer is chosen to be approximately 730° C. in this variant, while the V/III ratio during growing of the active layer is chosen to be approximately 700. Particularly favorable results were obtained when the MOVPE (=Metal Organic Vapor Phase Epitaxy) growing technique was used for the semiconductor layers in the method according to the invention. The buffer layer comprises, for example, galliumarsenide, as does the contact layer 6, but preferably gallium-aluminum arsenide having an aluminum content of at least approximately 6 at. % for a first cladding layer having a comparatively high degree of disorder and of at least approximately 9 at. % for a first cladding layer having a substantially disorderly distribution. In this way it is possible for the semiconductor layers, especially the first cladding layer, to be provided at a comparatively high growing temperature (for example, 730° C. for a buffer layer having at least 6 at. % aluminum, and for example, 760° C. for a buffer layer having at least 9 at. % aluminum), while the crystal quality and morphology of these layers remain good.

BRIEF DESCRIPTION OF THE DRAWING

The invention will now be explained in more detail with reference to three embodiments and the accompanying drawing, in which.

Figure 1:
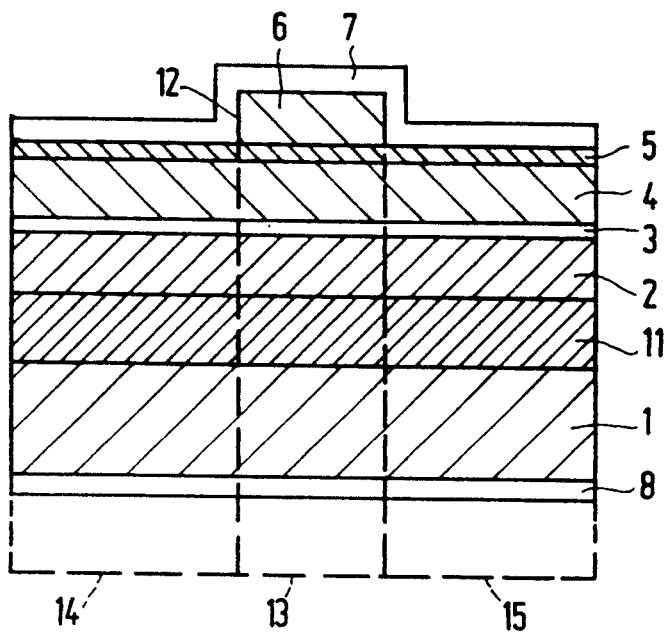
FIG. 1 shows an embodiment of a radiation-emitting semiconductor diode according to the invention in cross-section.

The Figures are diagrammatic and not drawn to scale, the dimensions in the thickness direction being particularly exaggerated for greater clarity. Corresponding parts are generally given the same reference numerals in the different embodiments. Semiconductor regions of the same conductivity type are hatched in the same direction as a rule.

DESCRIPTION OF THE PREFERRED EMBODIMENTS

FIG. 1 shows in cross-section a first embodiment of a radiation-emitting semiconductor diode according to the invention. The semiconductor diode comprises a semiconductor body with a substrate region 1 which is provided with a connection conductor 8 and which is of a first, in this case the n-conductivity type, and which consists in this embodiment of monocrystalline galliumarsenide. On this is provided a semiconductor layer structure which comprises inter alia a buffer layer 11 of the same, n-conductivity type. On this are applied in that order: a lower cladding layer 2 of the n-conductivity type, an active layer 3, and an upper cladding layer 4 of the opposite, here the p-conductivity type. The active layer 3 and the first cladding layer, in this case both cladding layers (2,4) comprise mutually differing semiconductor materials, in this case InGaP and InAlGaP, respectively, each of which comprises a mixed crystal of at least two, in this case exactly two for the active layer 3 and three for the first cladding layer (2, 4), binary compounds, in this case InP, AlP and GaP, and having two sub-lattices, namely two f.c.c. lattices, in which the atoms, here In, Al, and Ga atoms on the one hand and P atoms on the other hand forming the binary compounds are present, while atoms of different elements, in this case In and Ga atoms for the active layer 3 and In, Al and Ga atoms for the first cladding layer (2, 4) are present side by side on at least one of the sub-lattices, in this case the sub-lattice on which In, Al and Ga atoms are present. According to the invention, the distribution of the atoms of different elements, in this case In and Ga atoms for the active layer 3 and In, Al and Ga atoms for the first cladding layer (2, 4) over the first sub-lattice, here the f.c.c. lattice of the III-elements, is more strongly ordered in the active layer 3 than in the first cladding layer, in this case both the lower 2 and the upper 4 cladding layer, this more orderly distribution of the semiconductor material of the active layer 3, InGaP in this case, resulting in a reduced bandgap. In this embodiment the distribution of the atoms of different elements over the first sub-lattice is substantially random in the first cladding layer (2, 4), whereas the distribution of the atoms of different elements over the first sub-lattice within the active layer 3 is more strongly ordered. The result is, according to the invention, that the different in bandgap between the active layer 3 and the first cladding layer (2, 4) is comparatively great. This has for its consequence that the temperature dependence of the starting current of the semiconductor diode according to the invention is comparatively small, so that it has a high maximum operating temperature, while the emission wavelength, approximately 670 nm, is still in the visible range of the spectrum. A $T_o$ value of 130 K at an emission wavelength of 670 nm was found for the diode of this embodiment. The $T_o$ value was 110 K for comparable laser diodes in which the active layer 3 and the first cladding layer (2, 4) were both disorderly. The $T_o$ values found for 50 µm wide lasers are 110 K and 90 K, respectively. A semiconductor diode laser according to the invention has a substantially higher $T_o$ value than the known semiconductor diode laser for both widths of the active region. On top of the upper cladding layer there is an intermediate layer 5 of the opposite, here the p-conductivity type and made here of indium-gallium phosphide and a contact layer 6, also of the opposite, here the p-conductivity type and made of gallium arsenide in this case, forming a mesa-shaped strip 12. A conducting layer 7 is applied over this mesa-shaped strip, this layer forming a junction constituting a barrier with the subjacent intermediate layer 5 outside the mesa-shaped strip 12. Thus two strip-shaped regions 14 and 15 are created in the semiconductor body, through which no or substantially no current flows below a certain voltage when the conducting layers 7 and 8 are included in a current circuit. Within the semiconductor body there is a strip-shaped region 13, of which the mesa-shaped strip 12 forms part, within which a pn-junction is present which leads to emission of electromagnetic radiation in the case of a sufficiently high current strength in the forward bias direction. Since the conducting layer 7 has a good electrical contact with the contact layer 6, the region 13 forms a preferential path for the electric current. In this example, the radiation-emitting semiconductor diode is constructed as a diode laser of the gain-guided type. In view of the construction as a diode laser, the mesa-shaped strip 12 is bounded perpendicularly to the longitudinal direction by two mutually parallel mirror surfaces lying in the plane of the drawing and coinciding with natural cleaving surfaces of the crystal from which the semiconductor body is formed. Thus a resonance cavity for the generated radiation is formed in the strip-shaped region 13 in the active layer 3. The intermediate layer 5 comprising material having a bandgap lying between that of the upper cladding layer 4 and the contact layer 6 serves on the one hand to divide the different in bandgap between these layers into two approximately equal steps if this different should be comparatively large, so that the current-voltage characteristic of the diode is improved, and on the other hand to form the best possible junction with the conducting layer 7 which forms a barrier outside the strip-shaped region 12. The buffer layer comprises, for example, gallium arsenide, as does the contact layer 6, but it preferably comprises gallium-aluminum arsenide having an aluminum content which is at least equal to a minimum value belonging to the bandgap of the first cladding layer. In this embodiment, the aluminum content of the buffer layer is approximately 25 at. %. The first cladding layer may have a very slight degree of ordering since this layer, thanks to such a buffer layer, can be provided at a comparatively high temperature while good crystalline and morphological characteristics are still obtained. In the present example the following compositions, doping levels and thicknesses were used for the various semiconductor layers.

| Layer | Semiconductor | Type | Doping concentr. (at/cm$^3$) | Thickness (µm) | Bandgap |
|---|---|---|---|---|---|
| 1 | GaAs (substrate) | N | $2 \times 10^{18}$ | 350 | 1,4 |
| 11 | Al$_{0,2}$Ga$_{0,8}$As | N | $2 \times 10^{18}$ | 0,1 | 1,7 |
| 2 | In$_{0,5}$Al$_{0,3}$Ga$_{0,2}$P | N | $2 \times 10^{18}$ | 0,8 | 2,3 |
| 3 | In$_{0,5}$Ga$_{0,5}$P | | — | 0,08 | 1,9 |
| 4 | In$_{0,5}$Al$_{0,3}$Ga$_{0,2}$P | P | $4 \times 10^{17}$ | 0,8 | 2,3 |
| 5 | In$_{0,5}$Ga$_{0,5}$P | P | $1 \times 10^{18}$ | 0,1 | 1,9 |
| 6 | GaAs | P | $2 \times 10^{18}$ | 0,5 | 1,4 |

The width of the mesa-shaped strip 12 is approximately 5 or 50 µm. The conducting layer 8 on the substrate 1 is in this example a gold-germanium-nickel layer with a thickness of approximately 1000 Å. The conducting layer 7 is in this example formed by a platinum, a tantalum, and a gold layer having thicknesses of approximately 1000, approximately 500 and approximately 2500 Å respectively.

Figure 2:
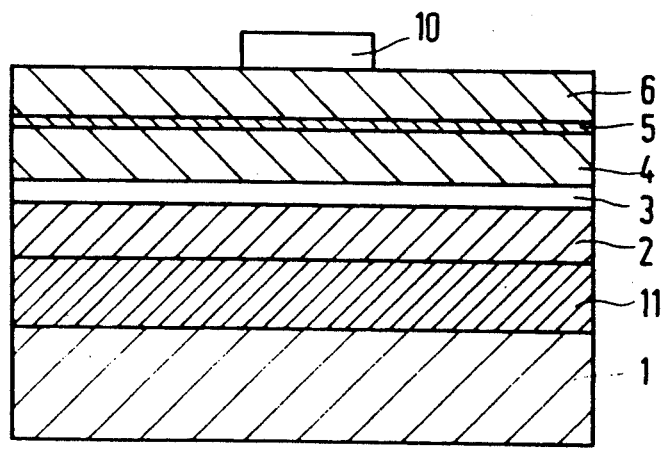
FIGS. 2 and 3 show the radiation-emitting semiconductor diode of FIG. 1 in consecutive stages of manufacture in cross-section.
Figure 3:
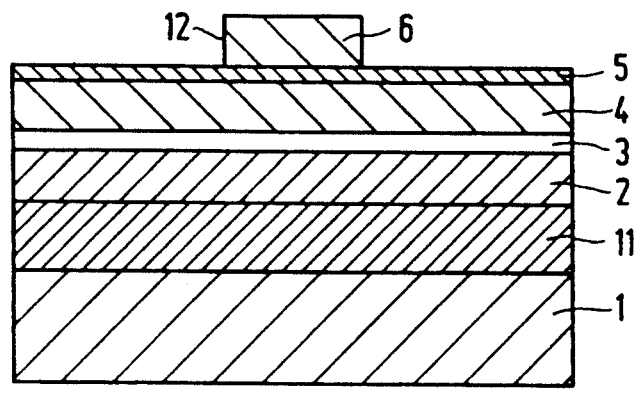
Figure 4:
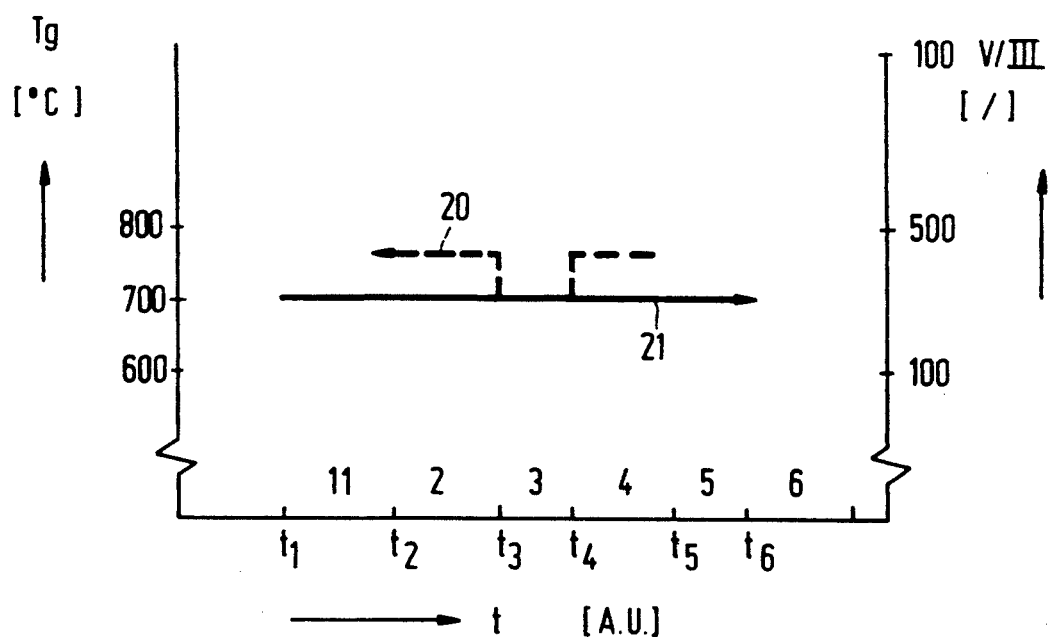
FIG. 4 shows the growing temperature and the V/III ratio as a function of time during the manufacture of the semiconductor body of the radiation-emitting semiconductor diode of FIG. 1 in a first embodiment of a method according to the invention.

According to the invention, the radiation-emiting semiconductor diode described is manufactured in the following way (see FIGS. 2 and 3). The starting material is a (001) substrate 1 of monocrystalline n-type gallium arsenide with a doping concentration of $2 \times 10^{18}$ atoms per cm$^3$ and a thickness of, for example 350 µm. After polishing and etching of the surface, the following are grown on this substrate, for example from the gas phase by means of OMVPE (=Organo Metallic Vapor Phase Epitaxy) in that order: a 0,5 µm thick layer 11 of n-type AlGaAs having an aluminum content of 20 at. % and a doping concentration of approximately $2 \times 10^{18}$ atoms per cm$^3$, a 0,8 µm thick layer 2 of n-type In$_{0,5}$Al$_{0,30}$Ga$_{0,20}$P having a doping concentration of approximately $2 \times 10^{18}$ atoms per cm$^3$, a 0,08 µm thick layer 3 of In$_{0,49}$Ga$_{0,51}$P, a 0,8 µm thick layer 4 of p-type In$_{0,5}$Al$_{0,30}$Ga$_{0,20}$P having a doping concentration of approximately $4 \times 10^{17}$ atoms per cm$^3$, a 0,08 µm thick layer 5 of p-type In$_{0,49}$Ga$_{0,51}$P having a doping concentration of $1 \times 10^{18}$ atoms per cm$^3$, and a 0,5 µm thick layer 6 of p-type GaAs having a doping concentration of approximately $1 \times 10^{18}$ atoms per cm$^3$. A 1 µm thick masking layer 10 is provided on this, for example, of photoresist in the form of a strip whose longitudinal axis is at right angles to the plane of the drawing of FIG. 2, which FIG. is a diagrammatic cross-section of the resulting structure. In the method according to the invention, mutually differing semiconductor materials are chosen for the active layer 3 and for at least one of the cladding layers (2, 4), to be called first cladding layer hereinafter, in this case InGaP for the active layer 3 and InAlGaP for the first cladding layer (2, 4), each comprising a mixed crystal of at least two binary compounds, in this case InP and GaP for the active layer 3 and InP, AlP and GaP, having two sub-lattices, namely two f.c.c. lattices, in which the atoms forming the binary compounds, here In, Al and Ga atoms on the one hand and P atoms on the other hand, are present, while atoms of different elements, here In and Ga atoms for the active layer 3 and In, Al and Ga atoms for the first cladding layer (2, 4), are present side by side on at least one of the sub-lattices, in this case the sub-lattice on which In, Al and Ga atoms are present. According to the invention, the growing conditions during providing of the first cladding layer (2, 4) and of the active layer 3 are so chosen that the atoms of different elements on the first sub-lattice are provided in a more ordered distribution in the active layer 3 than in the first cladding layer (2, 4) so that the bandgap of the semiconductor material of the active layer, here made of InGaP, is reduced. This is achieved in the method according to the invention in this example in that the growing temperature is taken to be such a growing condition: during growing of the first cladding layer (2, 4), in this case both cladding layers, the growing temperature $T_g$ is set for a higher value than usual, i.e. approximately 760° C., whereas a usual temperature of approximately 700° C. is set during growing of the active layer 3. During growing of both the active layer 3 and of the first cladding layer (2, 4) the V/III ratio is kept constant. FIG. 4 shows the growing temperature and the V/III ratio as a function of time during the manufacture of the semiconductor body of the radiation-emitting semiconductor diode of this example in a first embodiment of a method according to the invention. The moments $t_2$ and $t_3$ on the horizontal (time) axis mark the beginning and the end of the growth of the lower cladding layer 2, the corresponding moments for the upper cladding layer $t_4$ and $t_5$ while they are $t_3$ and $t_4$ for the active layer 3. The broken line 20 indicates the growing temperature value which is read on the vertical axis on the left. The drawn line 21 gives the V/III ratio which is indicated on the vertical axis on the right. By virtue of the comparatively high growing temperature during growth of the first cladding layer (2, 4), the distribution of the atoms of different elements, here In, Al and Ga, over the first sub-lattice is substantially random, so that the bandgap of the semiconductor material of the first cladding layer (2, 4) is comparatively great. During growing of the active layer 3, the comparatively low growing temperature leads to an ordering in the semiconductor material of this layer. As a result, this embodiment of the method according to the invention creates a comparatively great different in bandgap between the first cladding layer (2, 4) and the active layer 3 so that the radiation-emitting semiconductor diode of this example has the favorable characteristics mentioned above. Other growing techniques such as VPE (Vapour Phase Epitaxiy) or MBE (Molecular Beam Epitaxy) may also be chosen for the growing technique.

Subsequently a mesa-shaped strip 12 is etched in the semiconductor layer structure of FIG. 2 (see FIG. 3), the GaAs contact layer 6 being removed by means of an etchant containing $NH_3$, $H_2O_2$ and $H_2O$ in the ratio 2:1:50, whose etching rate at room temperature is approximately 0,7 μm/min. The subjacent $In_{0,50}Ga_{50}P$ intermediate layer 5 acts as an etching stopper layer here. After removal of the mask 10 and cleaning of the structure thus obtained, a conducting layer 8 consisting of, for example, a gold-germanium-nickel layer of approximately 1000 Å thickness (see FIG. 1) is provided on the substrate 1 by means of, for example, sputtering. Finally a conducting layer 7, for example consisting of a platinum, a tantalum and a gold layer with thicknesses of approximately 1000, approximately 500 and approximately 2500 Å, respectively, is provided over the upper side of the structure by means of, for example, the same technique. After cleaving of the substrate in a manner generally known, the individual radiation emitting semiconductor diodes, in this case diode lasers of the index-guided type, are available for final mounting.

Figure 5:
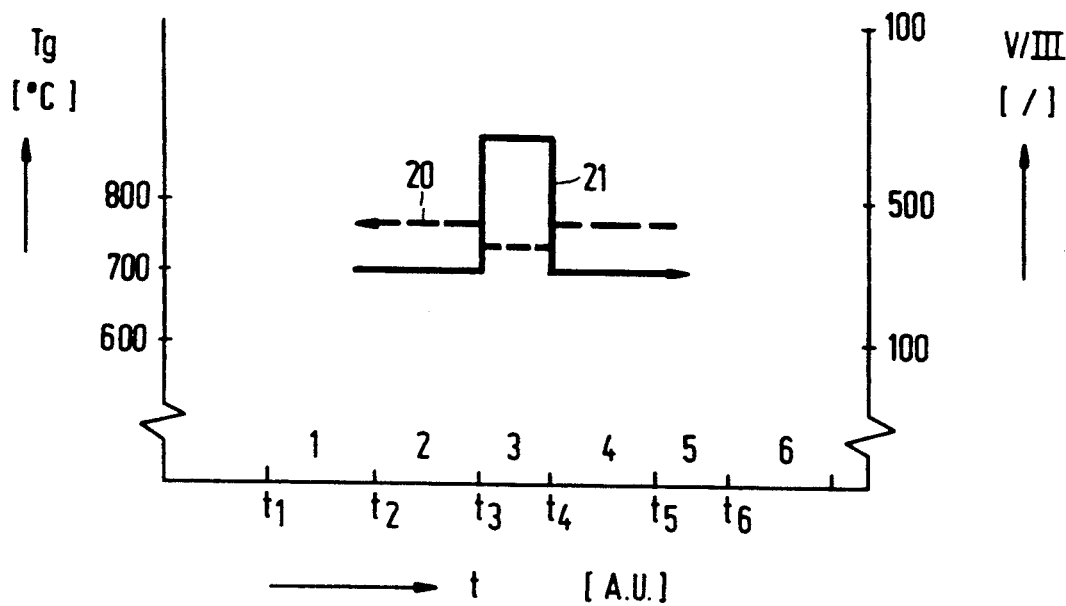
FIG. 5 shows the growing temperature and the V/III ratio as a function of time during the manufacture of the semiconductor body of the radiation-emitting semiconductor diode of FIG. 1 in a second embodiment of a method according to the invention.
Figure 6:
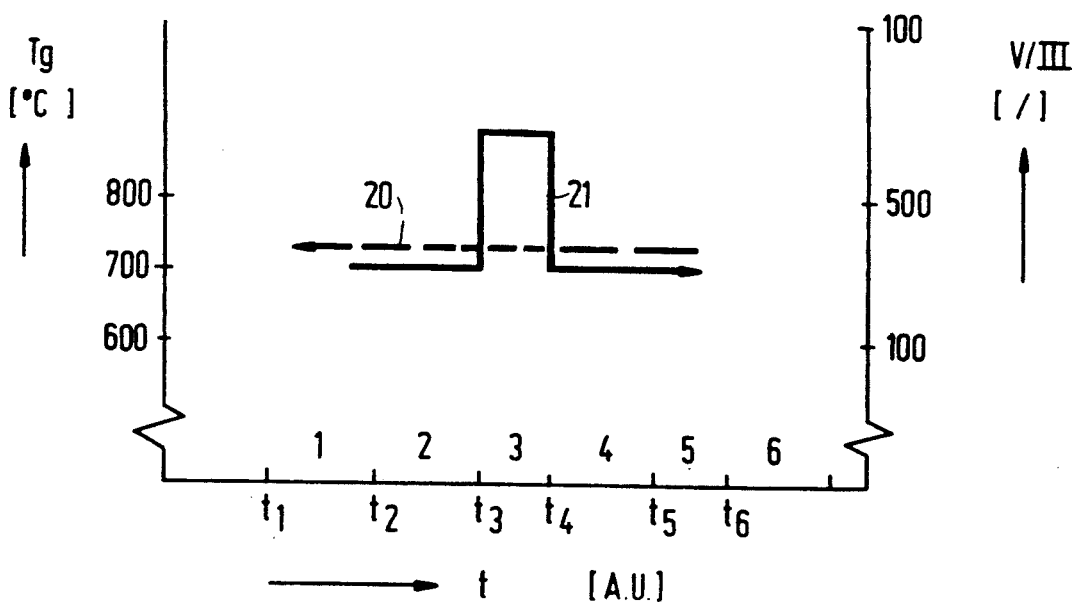
FIG. 6 shows the growing temperature and the V/III ratio as a function of time during the manufacture of the semiconductor body of the radiation-emitting semiconductor diode of FIG. 1 in a third embodiment of a method according to the invention.

FIGS. 5 and 6 show in a similar manner to FIG. 4 the growing temperature $T_g$ and the V/III ratio as a function of time during the manufacture of the semiconductor body of the radiation-emitting semiconductor diode of FIG. 1 in two further embodiments of the method according to the invention. In the embodiment corresponding to FIG. 5, the cladding layers 2, 4 are grown at a comparatively high temperature of, for example, 760° C., whereas the active layer 3 is grown at a slightly raised temperature of approximately 730° C. A difference in ordering results, as is the case in the method corresponding to FIG. 4, but the different in ordering caused by the growing temperature is smaller since the difference in temperature is smaller. This, however, has the advantage that the temperature switch-over between the active layer 3 and the cladding layers 2 and 4 can take place more quickly, which improves the quality of the interfaces between the active layer 3 and the cladding layers 2 and 4. To increase the different in the degree of ordering, the V/III ratio is also used as a growing condition by means of which the ordering is influenced in this embodiment. A V/III ratio of approximately 700 is set during growing of the active layer 3, so that ordering in the active layer is promoted. A V/III ratio of approximately 300 is used for the cladding layers 2,4. In the embodiment corresponding to FIG. 6, both the cladding layers 2, 4 and the active layer 3 are grown at a slightly raised growing temperature of, for example, 730° C. This has the advantage that the temperature need not be changed between the active layer 3 and the cladding layers 2 and 4, so that the quality of the interfaces between the active layer 3 and the cladding layers 2 and 4 is optimal. In this variant, the V/III ratio only is used as a growing condition for realizing a different in ordering between the first cladding layer (2, 4) and the active layer 3. A V/III ratio of approximately 700 is set during growing of the active layer 3, whereas a V/III ratio of approximately 300 is used for the cladding layers 2, 4. The V/III ratio, which is determined by the values of the gas flows of V-elements or compounds and of III-elements or compounds, can be set for a different value very quickly, so that the growing process can continue to take place practically continuously, which benefits the quality of the interfaces.

The invention is not limited to the embodiments given, since many modifications and variations are possible to those skilled in the art within the scope of the invention. Thus, other semiconductor materials or other compositions of the chosen semiconductor materials than those mentioned in the above embodiments may be used. Possible alternatives are II-VI materials and mixed crystals thereof with which emission in the blue range of the spectrum is possible. It is also possible to replace (simultaneously) all conductivity types with their opposites.

Depending on the application, it is possible to opt for an LED version or a laser version of a radiation-emitting semiconductor diode according to the invention. Although the concepts of starting current and especially $T_o$ value are generally only used for laser diodes with the object of characterizing inter alia the maximum operating temperature, the invention may also be advantageously applied in the case of an LED, especially a so-called super-radiation LED. In the laser version, both a gain-guided and an index-guided structure may be used. Finally, it should be noted that the methods for providing the semiconductor layers in the embodiments may be other than the MOVPE technology. Thus, MBE (Molecular Beam Epitaxy) or VPE (Vapor Phase Epitaxy) may be used instead of MOVPE.

We claim:

1. A radiation-emitting semiconductor diode comprising a semiconductor body with a semiconductor substrate of a first conductivity type on which are present at least, in that order, a lower cladding layer of the first conductivity type, an active layer, and an upper cladding layer of a second conductivity type, said active layer and at least one of said cladding layers, to be called first cladding layer hereinafter, comprising mutually differing semiconductor materials which each comprise a mixed crystal of at least two binary compounds with two sub-lattices, atoms of different elements being present side by side on at least one of said sub-lattices, to be called first sub-lattice hereinafter, characterized in that the distribution of the atoms of different elements over said first sub-lattice in said active layer is ordered to a greater extent than it is in said first cladding layer, and in that the different in the degree of ordering between said active layer and said first cladding layer results in an increased different between the bandgap of said active layer and the bandgap of said first cladding layer.

2. A radiation-emitting semiconductor diode as claimed in claim 1, in which said two sub-lattices are of the face centered cube type, characterized in that the distribution of the atoms of different elements over said first sub-lattice in said first cladding layer is substantially completely random whereas this distribution in said active layer is more ordered.

3. A radiation-emitting semiconductor diode as claimed in claim 1 or 2, in which said binary compounds are III-V compounds, characterized in that said active layer comprises indium-gallium phosphide (InGaP) or indium-aluminum-gallium phosphide (InAlGaP), and that said cladding layers comprise indium-aluminum-gallium phosphide (InAlGaP) with a higher aluminum content than said active layer or indium-aluminum phosphide (InAlP).

4. A radiation-emitting semiconductor diode as claimed in claim 3, characterized in that said substrate comprises gallium arsenide and is provided with a conducting layer at the lower side, while there are present on said upper cladding layer, in that order, an intermediate layer of indium-gallium phosphide or aluminum-gallium arsenide and a contact layer of gallium arsenide, which layers are of the second conductivity type, said semiconductor body comprising a mesa-shaped strip adjoining its surface, comprising at least said contact layer and covered by another conducting layer which extends to outside said mesa-shaped strip and outside said strip forms a junction constituting a barrier with a layer situated below it.

5. A radiation-emitting semiconductor diode as claimed in claim 3, characterized in that a buffer layer of aluminum-gallium arsenide (AlGaAs) is present between said substrate and said lower cladding layer, the aluminum content of said buffer layer having at least a minimum value belonging to the ordering of said first cladding layer.

6. A radiation-emitting semiconductor diode as claimed in claim 5, characterized in that the aluminum content in said buffer layer is at least approximately 6 atom percents.

7. A radiation-emitting semiconductor diode as claimed in claim 5, characterized in that the aluminum content in said buffer layer is at least approximately 9 atom percents.

* * * * *